(12) United States Patent
Bao et al.

(10) Patent No.: US 9,704,758 B2
(45) Date of Patent: *Jul. 11, 2017

(54) FORMING A SEMICONDUCTOR STRUCTURE FOR REDUCED NEGATIVE BIAS TEMPERATURE INSTABILITY

(71) Applicant: International Business Machines Corporation, Armonk, NY (US)

(72) Inventors: Ruqiang Bao, Wappingers Falls, NY (US); Siddarth A. Krishnan, Newark, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/254,192

(22) Filed: Sep. 1, 2016

(65) Prior Publication Data

US 2017/0148686 A1    May 25, 2017

Related U.S. Application Data

(60) Continuation of application No. 15/178,189, filed on Jun. 9, 2016, now Pat. No. 9,576,958, which is a
(Continued)

(51) Int. Cl.
*H01L 21/8238* (2006.01)
*H01L 29/51* (2006.01)
(Continued)

(52) U.S. Cl.
CPC .. *H01L 21/823857* (2013.01); *H01L 21/3115* (2013.01); *H01L 21/3215* (2013.01);
(Continued)

(58) Field of Classification Search
None
See application file for complete search history.

(56) References Cited

U.S. PATENT DOCUMENTS 6,780,730 B2    8/2004  Lin
7,456,448 B2    11/2008 Kotani et al.
(Continued)

FOREIGN PATENT DOCUMENTS

CN    102420187 A    4/2012
KR    1020000076854 A    12/2000

OTHER PUBLICATIONS

U.S. Appl. No. 14/947,350, filed Nov. 20, 2015.
(Continued)

*Primary Examiner* — Michelle Mandala
(74) *Attorney, Agent, or Firm* — Maeve Carpenter

(57) ABSTRACT

An approach to forming a semiconductor structure with improved negative bias temperature instability includes diffusing fluorine atoms into a semiconductor structure by an anneal in a fluorine containing gas. The approach includes removing a pFET work function metal layer from an area above an nFET wherein the area above the nFET includes at least the area over the nFET. Additionally, the approach includes depositing a layer of nFET work function metal on a remaining portion of the pFET work function metal and depositing a gate metal over the nFET work function metal layer. Furthermore, the method includes performing an anneal in a reducing environment followed by a high temperature anneal.

10 Claims, 6 Drawing Sheets

Related U.S. Application Data division of application No. 14/947,350, filed on Nov. 20, 2015, now Pat. No. 9,502,307.

(51) Int. Cl.
*H01L 21/3215* (2006.01)
*H01L 21/3115* (2006.01)

(52) U.S. Cl.
CPC .............. *H01L 21/82385* (2013.01); *H01L 21/823842* (2013.01); *H01L 29/517* (2013.01)

(56) References Cited

U.S. PATENT DOCUMENTS

| | | |
|---|---|---|
| 7,541,246 B2 | 6/2009 | Tamura et al. |
| 7,863,125 B2 | 1/2011 | Tsujikawa et al. |
| 8,319,295 B2 | 11/2012 | Collaert et al. |
| 8,551,876 B2 | 10/2013 | Wang |
| 8,916,432 B1 | 12/2014 | Ramkumar |
| 9,343,372 B1 | 5/2016 | Bao |
| 9,502,307 B1* | 11/2016 | Bao .................. H01L 21/823842 |
| 2002/0051894 A1 | 5/2002 | Yoshikawa |
| 2004/0207010 A1 | 10/2004 | Furuhata |
| 2007/0218663 A1* | 9/2007 | Hao .................. H01L 21/28176 438/532 |
| 2008/0070367 A1* | 3/2008 | Pae .................. H01L 21/28167 438/287 |
| 2010/0127335 A1 | 5/2010 | Niimi |
| 2012/0175711 A1 | 7/2012 | Ramachandran |
| 2014/0077313 A1 | 3/2014 | Li et al. |

OTHER PUBLICATIONS

List of IBM Patents or Patent Applications Treated as Related (Appendix P), filed herewith.

U.S. Appl. No. 15/178,189, filed Jun. 9, 2016.

* cited by examiner

FORMING A SEMICONDUCTOR STRUCTURE FOR REDUCED NEGATIVE BIAS TEMPERATURE INSTABILITY

BACKGROUND OF THE INVENTION

The present invention relates generally to the field of semiconductor technology, and more particularly to semiconductor manufacture.

Semiconductor device scaling to smaller feature sizes is facing significant challenges. Traditional semiconductor materials and processes for device formation become less effective as physical dimensions shrink down to the nanometer regime. With this reduction in feature size, the thickness of gate dielectrics layers has continually decreased. As gate layers become thinner, a number of issues arise. Time-related voltage breakdowns, hot carrier effects, and diffusion of impurities from the gate electrode to the substrate may occur which can adversely affect the stability of transistors formed with thinner gate dielectric materials. The migration to high-k gate dielectric materials that improve gate current density for a similar effective oxide thickness may be done for improved electrical performing in shrinking devices particularly, in sub-micron regimes.

Negative bias temperature instability (NBTI) is a key reliability issue in metal-oxide semiconductor field-effect devices (MOSFET). NBTI is observed as an increase in the threshold voltage with an associated decrease in drain current and transconductance of semiconductor devices over time. NBTI occurs when a gate electrode is negatively biased at high temperatures, which may result in a drift in the electrical performance of a MOSFET device. NBTI is of particular concern in p-channel devices that operate at high temperatures with negative gate to source voltage. With the introduction of high k dielectrics and the use of metal gates, a similar mechanism, positive bias temperature instability (PBIT) may be observed with n-channel devices when a positive gate to source voltage is applied at high temperatures over time.

SUMMARY

Embodiments of the present invention provide a method of forming a semiconductor structure with improved negative bias temperature instability. The method includes diffusing fluorine atoms into a semiconductor structure by an anneal in a fluorine containing gas and removing a pFET work function metal layer from an area above an nFET wherein the area above the nFET includes at least the area over the nFET. The method includes depositing a layer of nFET work function metal on a remaining portion of the pFET work function metal and depositing a gate metal over the nFET work function metal layer. Furthermore, the method includes performing an anneal in a reducing environment followed by a high temperature anneal.

DETAILED DESCRIPTION

Figure 1:
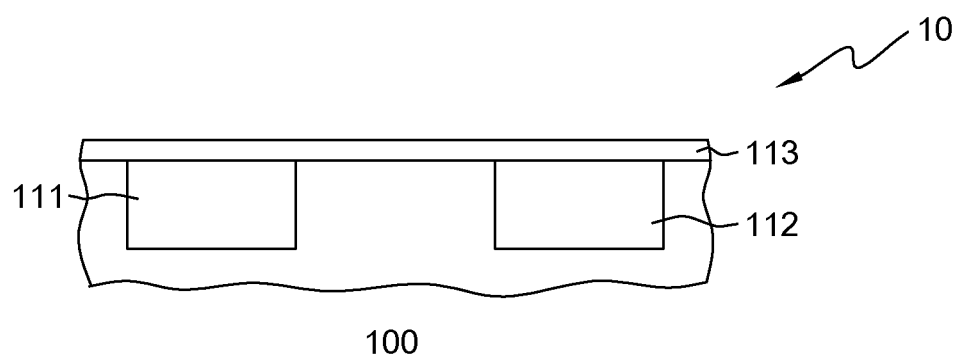
FIG. 1 depicts a cross-sectional view of a semiconductor structure in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The figures represent cross-section portions of a semiconductor chip or a semiconductor wafer during fabrication and are not drawn to scale, but instead are drawn to illustrate the features of the described embodiments. Specific structural and functional details disclosed herein are not to be interpreted as limiting, but merely as a representative basis for teaching one skilled in the art to variously employ the methods and structures of the present disclosure. In the description, details of well-known features and techniques may be omitted to avoid unnecessarily obscuring the presented embodiments.

References in the specification to "one embodiment", "other embodiment", "another embodiment", "an embodiment", etc., indicate that the embodiment described may include a particular feature, structure or characteristic, but every embodiment may not necessarily include the particular feature, structure or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "over", "on", "positioned on" or "positioned atop" mean that a first element is present on a second element wherein intervening elements, such as an interface structure, may be present between the first element and the second element. The term "direct contact" means that a first element and a second element are connected without any intermediary conducting, insulating or semiconductor layers at the interface of the two elements.

The reference numbers initially used to identify materials, layers or elements will be retained in subsequent drawings. Because semiconductor substrates (e.g., wafers) at the various processing steps for the semiconductor structures depicted contain the same elements (e.g. oxides, gate dielectrics, work function metals, gates electrodes and similar elements), the reference numbers for these elements has been left the same in the various semiconductor structure processing steps. However, if the reference number of an element in a wafer is explicitly stated initially, it will be continued for the processing of the wafer to avoid confusion and any changes to the element will be clearly stated.

In the interest of not obscuring the presentation of the embodiments of the present invention, in the following detailed description, some of the processing steps or operations that are known in the art may have been combined together for presentation and for illustration purposes and in some instances may not have been described in detail. In other instances, some processing steps or operations that are known may not be mentioned at all. It should be understood that the following description is focused on the distinctive features or elements of the various embodiments of the present invention.

Embodiments of the present invention recognize NBTI is a reliability concern for metal replacement gate structures especially when materials such as high k dielectrics are used to provide equivalent oxide thickness (EOT) in semiconductor devices with reduced circuit sizes and shorter channel lengths. Nitride metals have a higher work function and therefore may be commonly used for p-channel field effect transistors (pFETs). It is also known that nitrogen incorporation in the interfacial layer composed of silicon and/or silicon dioxide (SiO2) during metallization increases NBTI. Research has shown that fluorine incorporation by implantation or plasma injection in to the interfacial layer can reduce NBTI. Embodiments of the present invention recognize that providing uniformity of the incorporated fluorine introduced with implantation or plasma injection for semiconductor devices, especially nano-wire and finFET devices can be challenging due to the complex structure.

Embodiments of the present invention provide a method to improve NBTI for metal replacement gate structures in semiconductor devices by driving fluorine into the interfacial layer using diffusion followed by an anneal in a reducing environment composed of hydrogen or deuterium gas. The semiconductor structures, materials, and processes discussed in the embodiments of the present invention provide a method for the diffusion of fluorine in the interfacial layer of a semiconductor structure and the incorporation of hydrogen or deuterium atoms in the semiconductor structure of semiconductor devices such as metal-oxide semiconductor field-effect transistors (MOSFET) including finFETs, and nano wire devices to reduce NBTI.

The present invention will now be discussed with reference to the Figures. FIG. 1 depicts a cross-sectional view of semiconductor structure 10 in accordance with an embodiment of the present invention. As depicted, FIG. 1 depicts a semiconductor structure that includes substrate 100, nFET 111, pFET 112, and interfacial layer 113.

Substrate 100 is a semiconductor substrate. In various embodiments, substrate 100 is a single crystal silicon substrate. Substrate 100 may be composed of a low defect density semiconductor material that may be a single crystal, an amorphous, or a polycrystalline semiconductor. Substrate 100 may be doped, undoped, or contain doped or undoped regions. Substrate 100 may be strained, unstrained or a combination thereof. In another embodiment, substrate 100 may be composed of any suitable semiconductor material compatible with silicon on insulator (SOI) processes. In an embodiment, substrate 100 is composed any suitable semiconductor material. For example, substrate 100 may be SiGe, Ge, GaAs, InP, any suitable group IV semiconductor, any suitable compound group IV semiconductor material, any suitable group IV, group III-V or group II-VI semiconductor material. Substrate 100 may also consist of two materials with different lattice constants, in which case the upper portion of the substrate is grown thick such that the upper portion has a low density of defects (this is often called "virtual" substrate) and therefore, the upper portion is of device quality, that is, a quality level capable of use in fabricating semiconductor devices and circuits.

NFET 111 is an n type MOSFET device. The n type MOSFET device be any type of suitable n type MOSFET device as known to one skilled in the art. For example, nFET 111 may be a planar MOSFET device, a finFET device, a vertical tunneling FET device, a nanowire device, a CMOS device, or any other suitable type of MOSFET device formed with known semiconductor processes. While depicted in FIG. 1 as a single nFET, one or more nFETs may be present in the semiconductor structure depicted in FIG. 1.

PFET 112 is a p type MOSFET device. The p type MOSFET device may be a planar MOSFET device, a finFET device, a CMOS device, a vertical tunneling FET device, a nano-wire device, or any other suitable type of MOSFET device created with known semiconductor processes. While depicted in FIG. 1 as a single pFET, one or more pFETs may be present in the semiconductor structure depicted in FIG. 1.

Interface layer 113 is a dielectric material deposited on a semiconductor substrate (i.e., substrate 100) with nFET 111 and pFET 112 formed in the semiconductor substrate (i.e., semiconductor wafer). For example, interfacial layer 113 may be composed of interfacial materials such as $Si_xO_y$, $SiGeO_x$, $SiO_xN_y$, $SiGeO_xN_y$, and any other known suitable interfacial materials for substrate 100. Interfacial layer 113 can be formed by a process such as a thermal anneal, a thermal oxidation, an in-situ steam generated (ISSG) oxide process, an ozone process using $O_3$, or a plasma process. The thickness of the deposited interfacial layer 113 is in the range of 5 angstroms to 20 angstroms. Interfacial layer 113 forms an interfacial layer with the semiconductor material of substrate 100. For example, interfacial layer 113 composed of a dielectric material such as $SiO_2$ forms an interfacial layer with the semiconductor material such as silicon that forms substrate 100. However, the embodiments of the present invention are not limited to these materials, in other examples; the semiconductor material may be a SiGe material with $SiGeO_x$, $SiO_2$ or other dielectric material.

In some embodiments, a dummy gate is present on interfacial layer 113. In this case, the dummy gate is removed by standard wet chemical etch processes or RIE to expose interfacial layer 113 for subsequent processing as discussed in reference to FIGS. 2 through 11. The dummy gate may be composed of an industry standard gate material for dummy gate electrodes such as polysilicon or amorphous silicon (a-Si).

Figure 2:
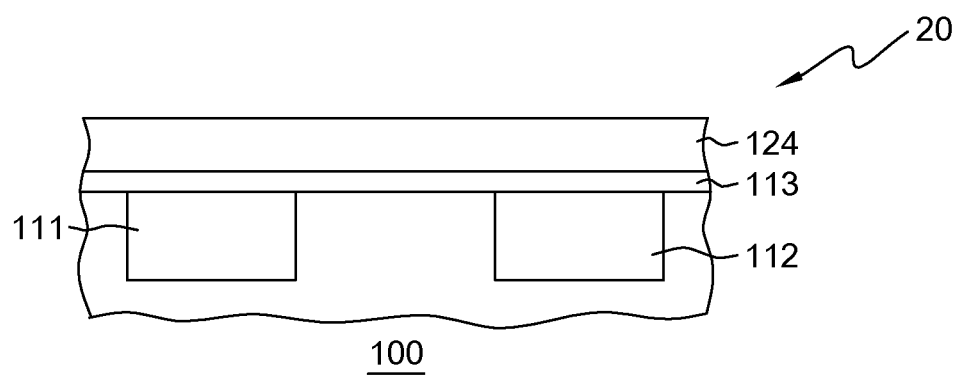
FIG. 2 depicts a cross-sectional view of the semiconductor structure after high k dielectric deposit in accordance with an embodiment of the present invention.

FIG. 2 depicts a cross-sectional view of semiconductor structure 20 after high k dielectric deposit in accordance with an embodiment of the present invention. FIG. 2 includes substrate 100, nFET 111, pFET 112, interfacial layer 113, and gate dielectric 124. Gate dielectric 124 is a layer of dielectric material deposited on interfacial layer 113. In various embodiments, gate dielectric 124 a high-k dielectric material. In some embodiments, gate dielectric 124 is composed of $HfO_2$. In other embodiments, gate dielectric 124 is composed of one of the following materials: $ZrO_2$, $TiO_2$, $Al_2O_3$, $La_2O_3$, $Y_2O_3$, $LaAlO_3$, $HfSiO_2$, and $SrTiO_3$. Gate dielectric 124 may be deposited with known techniques including, but not limited to chemical vapor deposition (CVD), plasma enhanced chemical vapor deposition (PECVD), atomic layer deposition (ALD), physical vapor deposition (PVD), or other similar deposition processes. Typical thickness for gate dielectric 124 are in the range 10 angstroms to 50 angstroms. In one embodiment, gate dielectric 124 is composed of any material suitable for forming a gate dielectric. A post deposition anneal is performed on interfacial layer 113 and gate dielectric 124. In one embodiment, gate dielectric 124 is deposited on substrate 100.

Figure 3:
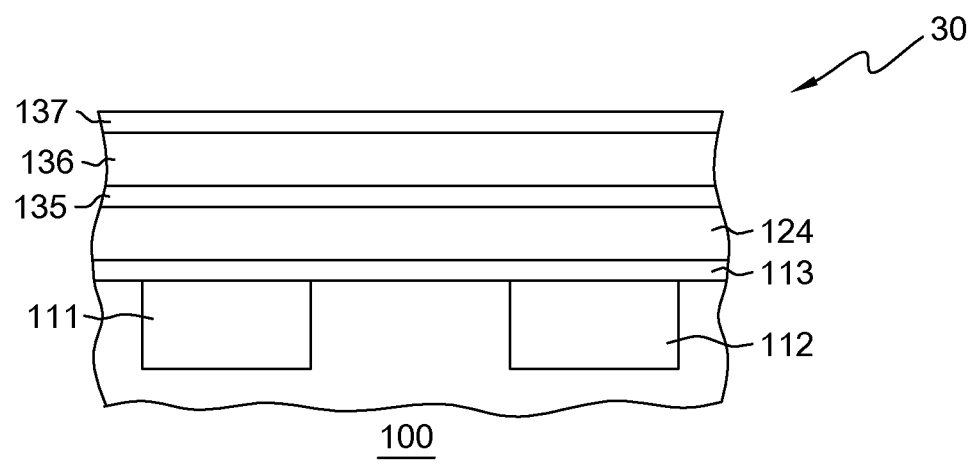
FIG. 3 depicts a cross-sectional view of the semiconductor structure after nFET work function metal deposit in accordance with an embodiment of the present invention.

FIG. 3 depicts a cross-sectional view of semiconductor structure 30 after nFET work function metal deposit in accordance with an embodiment of the present invention. FIG. 3 includes the elements of FIG. 2 and the deposited nFET work function metal layers depicted as barrier 135, nFET work function metal 136, and cap 137. Barrier 135 is a material suitable for providing a barrier between gate dielectric 124 and nFET work function metal 136. In various embodiments, barrier 135 is TiN. In other embodiments, barrier 135 is composed of other nitride containing metal materials. For example, barrier 135 can be TiSiN or TaN. A typical barrier layer thickness would be in the range of 2 angstroms to 25 angstroms. Barrier 135 is deposited with known deposition processes such as molecular beam epitaxy (MBE), CVD, plasma enhanced CVD (PECVD), atomic layer deposition (ALD), PVD or other similar deposition methods, for example. In some embodiments, barrier 135 is not present. NFET work function metal 136 is deposited on barrier 135. NFET work function metal 136 is a work function metal used in an nFET device. In one embodiment, nFET work function metal 136 is deposited on gate dielectric 124 (i.e., when no barrier layer is present). Typical n type work function metals for nFET devices include materials such as TiAl, Ti, TaAlC, TiAlC, and Al, for example. Typical layer thickness ranges for nFET work function metal 136 are 20 angstroms to 100 angstroms. NFET work function metal 136 is deposited with known processes such as MBE, CVD, PECVD, ALD, PVD, or other similar deposition methods.

Cap 137 is deposited on nFET work function metal 136 by known methods such as CVD, PVD, or ALD. In some embodiments, cap 137 is not present (i.e., cap 137 is an optional layer in semiconductor structure 30). Cap 137 is composed of TiN however; it is not limited to this material and may be composed of another material suitable for a cap on an n type work function metal layer.

Figure 4:
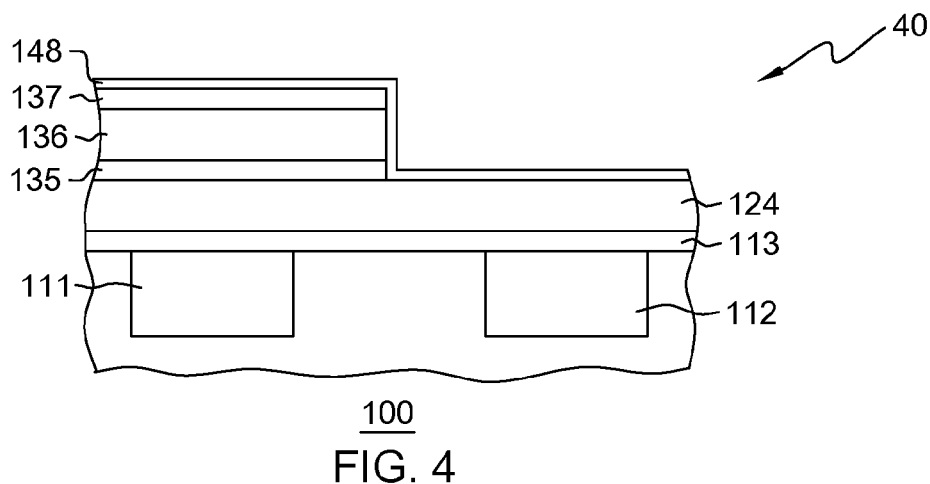
FIG. 4 depicts a cross-sectional view of the semiconductor structure after selective removal of nFET work function metal and pFET work function metal deposition in accordance with an embodiment of the present invention.

FIG. 4 depicts a cross-sectional view of semiconductor structure 40 after selective removal of nFET work function metals (e.g., barrier 135, nFET work function metal 136, and cap 137) and pFET work function metal 148 deposition in accordance with an embodiment of the present invention. Standard lithography and etch processes such as reactive ion etch (RIE) or wet chemical etch are used to remove barrier 135, nFET work function metal 136, and cap 137 from the pFET region over pFET 112 as depicted in FIG. 4. A thin layer of pFET work function metal is deposited on the remaining cap 137 layer and the exposed surface of gate dielectric 124. PFET work function metal 148 may be composed of any pFET work function metal compatible with the high k dielectric material and cap 137 or nFET work function metal 136 if no cap is present. PFET work function metal 148 is deposited by atomic layer deposition (ALD), molecular beam epitaxy (MBE) chemical vapor deposition (CVD), plasma enhanced (PE) CVD, atomic layer deposition (ALD), plasma vapor deposition (PVD) or other similar deposition methods, for example, on the exposed high k gate dielectric and cap 137 with a thickness in the range of 10 angstroms to 50 angstroms.

In some embodiments, fluorine is incorporated in semiconductor structure 40 after pFET work function metal 148 deposit. An annealing process in a gas environment containing fluorine atoms is performed after deposition of pFET work function metal 148. The annealing process incorporates fluorine atoms into semiconductor structure 40. Semiconductor structure 40 is placed in a fluorine gas-containing environment to diffuse fluorine atoms into semiconductor structure 40. For example, an environment or gas chamber containing fluoride gas or a fluoride containing gas such as $WF_6$, $NF_3$, or $F_2$, may be used to introduce fluorine atoms into the layers of semiconductor structure 40. The gas environment may be heated to temperatures in the range 250 degrees Celsius to 500 degrees Celsius, however is not limited to this temperature range. Annealing occurs in the chamber or gas environment for a range of dwell times. Typical dwell times for diffusion of fluorine into semiconductor structure 40 is in the range of 2 minutes to 30 minutes. The dwell time may be dependent on a number of factors such as temperature, type of gas (e.g., fluorine gas, $WF_6$, or $NF_3$), gas concentration, and the thickness of pFET work function metal 148. Using this process, fluorine atoms may be diffused in to pFET work function metal 148, cap 137, nFET work function metal 136, barrier 135, and gate dielectric 124.

In this embodiment, after fluorine incorporation by diffusion in a fluorine containing gas environment, a gate electrode (i.e., layer 159 in FIG. 5) is deposited. The gate electrode material may be any metal gate electrode material. For example, the gate electrode material may be one of the following metals: tungsten, tantalum, tantalum nitride, platinum, Al, TiAl, TiN, or gold. The gate electrode material may be deposited in these embodiments with known deposition methods such as MBE, CVD, PECVD, ALD, PVD, or other similar deposition methods. After gate electrode deposition (i.e., layer 159 in FIG. 5), the semiconductor structure, now semiconductor structure 50, undergoes a high temperature anneal.

Figure 5:
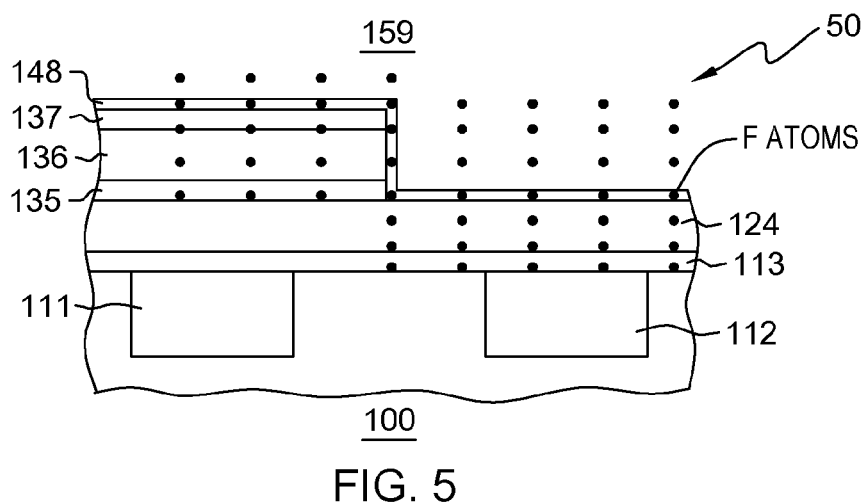
FIG. 5 depicts a cross-sectional view of the semiconductor structure after gate electrode metal deposition in a fluorine environment in accordance with an embodiment of the present invention.

FIG. 5 depicts a cross-sectional view of semiconductor structure 50 after gate electrode metal deposition with fluorine containing precursor in accordance with an embodiment of the present invention. A layer of gate electrode metal, layer 159 is deposited by known processes using a fluorine (F) containing precursor that is a fluorine-containing environment. In various embodiments, tungsten (W) is deposited using CVD with a fluorine-containing precursor or gas source such as $WF_6$. For example, a layer of tungsten is deposited as a gate electrode material over pFET work function metal 148 using CVD with a WF$_6$ atmosphere. The deposition of tungsten occurs at temperatures in the range 250 to 500 degrees C. and fluorine atoms from WF$_6$ are incorporated into layer 159.

In some embodiments, a high temperature anneal is performed after deposition of layer 159. The high temperature anneal is performed at temperatures in the range of 450 to 650 degrees C. The high temperature anneal, in addition to reducing interlayer metal stresses, drives fluorine incorporation in layer 159 and the adjoining layers of semiconductor structure 50. For example, fluorine atoms diffuse into pFET work function metal 148, cap 137, nFET work function metal 136, barrier 135, gate dielectric 124, and interfacial layer 113 as depicted in FIG. 5. The depth of fluorine atom penetration may vary depending on the thickness of the layers in semiconductor structure 50 and the annealing process (dwell time, anneal temperature, and environment). In one embodiment, high temperature annealing is done in a forming gas environment. In one embodiment, the high temperature anneal is not performed and fluorine atoms are incorporated by the CVD process and temperatures.

After layer 159 deposition a number of standard semiconductor device wafer processing steps may occur as known to one skilled in the art. For example, a chemical mechanical polish (CMP) may be performed on the surface of layer 159 to planarize layer 159 or to reduce layer 159 thickness in addition to other known semiconductor wafer processes.

Figure 6:
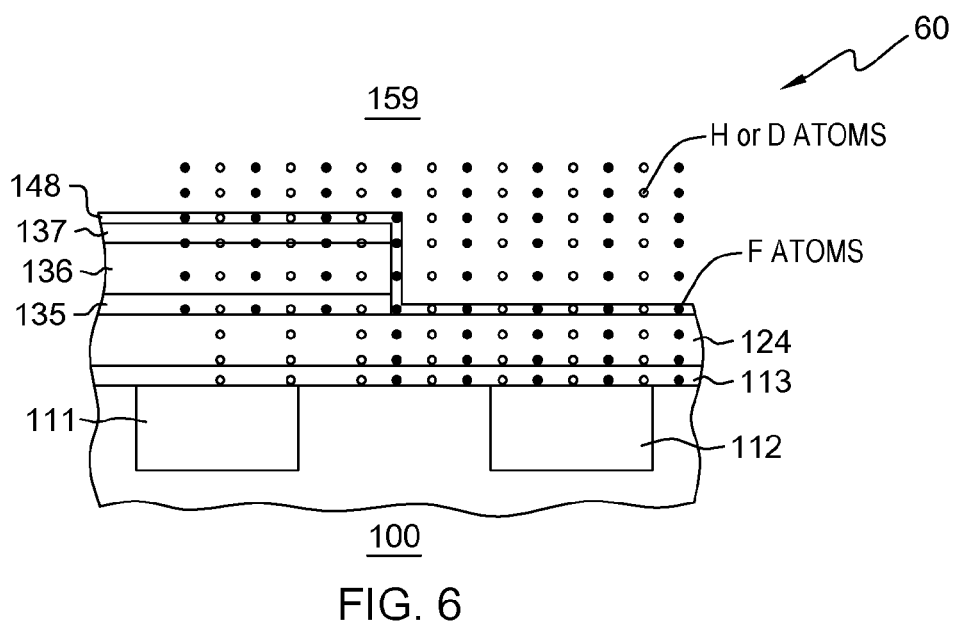
FIG. 6 depicts an illustration of the results of fluorine and reducing atom diffusion in the semiconductor structure in accordance with an embodiment of the present invention.

In addition, annealing in a reducing environment anneal occurs using a hydrogen or deuterium gas environment. A chamber or similar environment containing a gas such as hydrogen or deuterium may be heated to 250 to 500 degrees C. The pressure for the reducing environment anneal may be in the range of 1 to 2 atmospheres but may be as high as 28 atmospheres. In some embodiments, the reducing environment anneal occurs as a high pressure anneal in a deuterium gas. For example, a high pressure anneal in a range of pressure such as 3 to 28 atmospheres may occur with an element or gas such as deuterium (D$_2$). The high pressure anneal using a deuterium gas environment may occur for 15 minutes to 3 hours. In some embodiments, the reducing environment anneal occurs in a forming gas such as hydrogen gas, a hydrogen and nitrogen gas mixture, or a deuterium and nitrogen gas mixture. The reducing environment anneal drives the hydrogen gas atoms or the deuterium gas atoms into semiconductor structure 50 by diffusion as depicted in FIG. 6. For example, as depicted in FIG. 6, hydrogen atoms are diffused in the top layers of semiconductor structure 50. The gas atoms diffusing into semiconductor structure 50 during anneal include hydrogen and deuterium atoms, for example, depending on the respective elements during the anneal process. In an embodiment, the reducing gas elements are not limited to these elements but may be any other suitable reducing or forming gas elements. When the high pressure anneal is performed, deuterium atoms are incorporated into semiconductor structure 60 (i.e., deuterium atoms would be depicted as unfilled circles in FIG. 6). In various embodiments, a high temperature (450 degrees Celsius to 650 degrees Celsius) is performed after the reducing environment anneal to drive reducing atoms (e.g., deuterium or hydrogen atoms) and fluorine atoms into the semiconductor structure.

A CMP of the gate electrode (e.g., layer 159) may be performed followed by the reducing gas anneal (i.e., as discussed above) or a high pressure anneal in deuterium is performed at temperatures ranging from 250 to 500 degrees Celsius.

FIG. 6 depicts an illustration of fluorine and reducing gas atoms diffusion in the semiconductor structure 60 in accordance with an embodiment of the present invention. FIG. 6 depicts the incorporation of fluorine atoms and reducing gas atoms depicted as either hydrogen atoms or deuterium atoms in semiconductor structure 60. The deuterium atoms or hydrogen atoms are incorporated into semiconductor structure 60 during the anneal in a reducing environment. The larger dark, filled circles represent fluorine atoms and the smaller unfilled circles represent the reducing gas atoms (e.g., deuterium or hydrogen atoms). For example, when the reducing gas is deuterium gas, deuterium atoms diffuse into the semiconductor structure. FIG. 6 depicts the incorporation or the diffusion of the reducing gas atoms (i.e., hydrogen or deuterium atoms) into semiconductor structure 60 includes the atoms penetrating at least layer 159, pFET work function metal 148, a portion of gate dielectric 124, a portion of barrier 135, a portion of nFET work function metal 136, a portion of cap 137, and a portion of interfacial layer 113 in this example. FIG. 6 is intended to be representative of the typical incorporation of fluorine atoms and reducing gas atoms such as deuterium or hydrogen atoms in semiconductor structure 60 however, variations in the depth of incorporation or diffusion of atoms may vary due to process temperature, pressure, gas composition, dwell time variations during anneal, and layer thickness variations within semiconductor structure 60.

Figure 7:
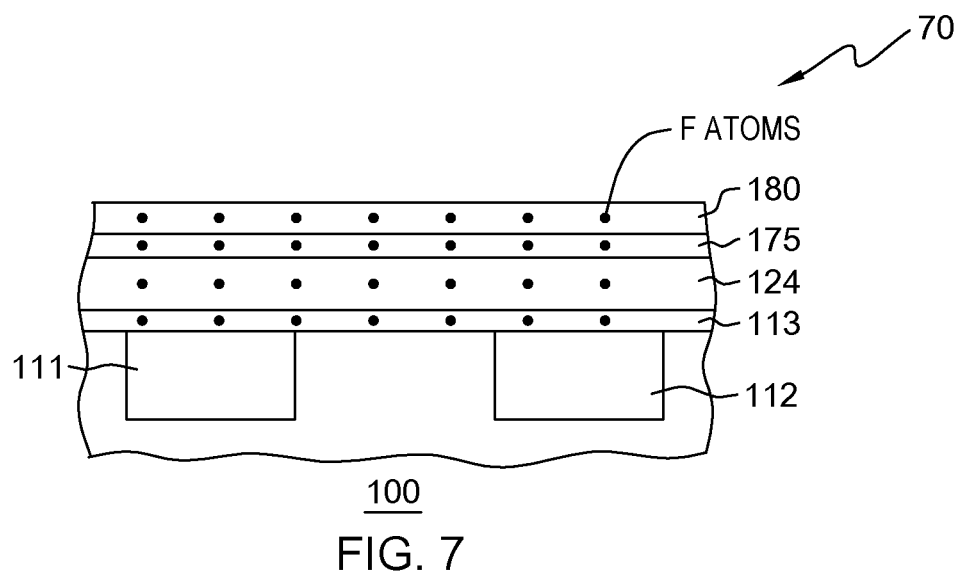
FIG. 7 depicts a cross-sectional view of the semiconductor structure after high k dielectric deposition in accordance with an embodiment of the present invention.

FIG. 7 depicts a cross-sectional view of semiconductor structure 70 after pFET work function metal deposition and tungsten deposition in accordance with an embodiment of the present invention. FIGS. 7 through 10 depict the processes and structures used in alternate embodiments of the present invention. FIG. 7 begins with semiconductor structure 20 (e.g., after deposition of gate dielectric 124 and the post deposition anneal of semiconductor structure 20). A layer of pFET work function metal 175 is deposited on the surface of gate dielectric 124. PFET work function metal 175 is deposited by CVD, PCD, or ALD, for example. PFET work function metal 175 is composed of commonly used work function metals for pFETs. In various embodiments, pFET work function metal 175 is composed of TiN, however, pFET work function metal 175 may be composed of other suitable metals for pFETs that provide a suitable work function capability in semiconductor structure 70. When a layer of tungsten is deposited with fluorine atoms included over pFET work function metal, TiN is preferred for pFET work function metal 175. A typical thickness for pFET work function metal 175 is in the range of 10 angstroms to 25 angstroms.

Layer 180 is deposited over pFET work function metal 175. In various embodiments, layer 180 is a metal layer that includes fluorine atoms. For example, layer 180 is composed of tungsten deposited using CVD with a fluorine-containing precursor or gas source such as WF$_6$. The deposition of tungsten occurs at temperatures in the range 250 to 500 degrees C. and fluorine atoms from WF$_6$ are incorporated into at least layer 180.

In various embodiments, a high temperature anneal is performed after deposition of layer 180. The high temperature anneal is performed at temperatures in the range of 450 to 650 degrees C. The high temperature anneal in addition to reducing interlayer metal stresses, drives fluorine incorporation in layer 180 and the adjoining layers of semiconductor structure 70. For example, as depicted in FIG. 7, fluorine atoms are diffused into layer 180, pFET work function metal 175, gate dielectric 124, and interfacial layer 113. The depth of fluorine atom penetration may vary depending on the thickness of the layers in semiconductor structure 70 and the annealing process (dwell time, anneal temperature, and annealing environment). In one embodiment, high temperature annealing is done in a forming gas environment. In some embodiments, layer 180 is another gate electrode metal deposited in a fluorine containing gas.

In some other embodiments, fluorine incorporation in semiconductor structure 70 occurs by an anneal in a fluorine containing gas environment (e.g., in a fluorine gas, a $WF_6$ gas, or a $NF_{3\ gas}$) after the deposition of pFET work function metal 175. In these embodiments, layer 180 is not deposited and the fluorine atoms are incorporated into the semiconductor structure by diffusion without the deposition of layer 180. In this case, barrier 191 (depicted later in FIG. 9) is deposited directly on pFET work function metal 175 and layer 180 is not present. In these embodiments, the reducing anneal occurs after deposition of the gate metal (e.g., gate 199 in FIGS. 10A and 10B). A high temperature anneal with a temperature range 450 degrees Celsius to 650 degrees Celsius may be performed after the reducing environment anneal.

FIG. 7 depicts an illustration of fluorine atom diffusion in semiconductor structure 70 in accordance with an embodiment of the present invention. FIG. 7 depicts a representation incorporating fluorine atoms into semiconductor structure 70. The dark filled circles represent fluorine atom encroachment by diffusion into semiconductor structure 70. The actual depth of fluorine atom penetration in semiconductor structure 70 is dependent on the process temperature, dwell time at temperature, and the materials used (i.e., the gases present at deposition and post deposition annealing).

Figure 8:
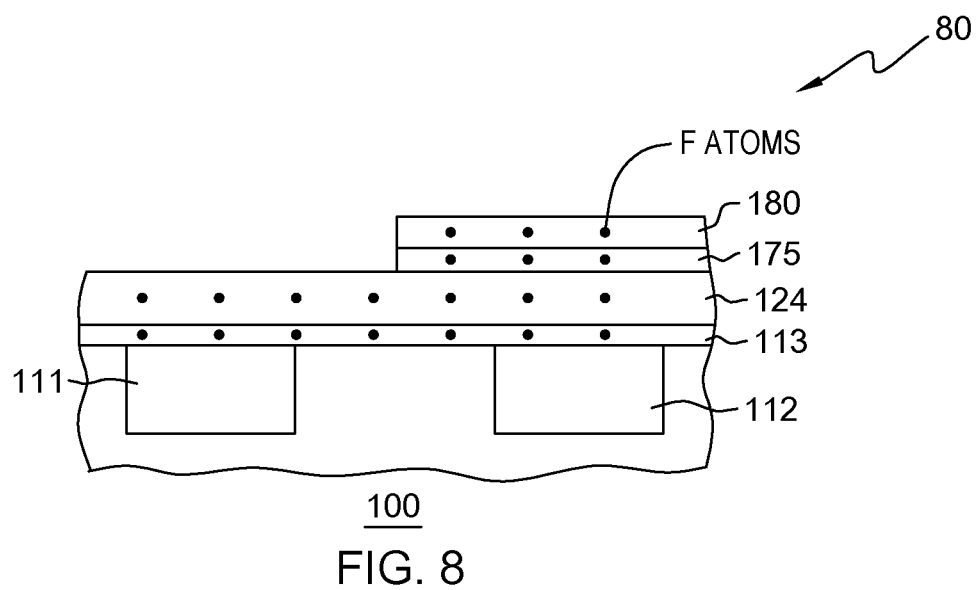
FIG. 8 depicts a cross-sectional view of the semiconductor structure after selective removal of pFET work function metal and a gate metal layer in accordance with an embodiment of the present invention.

FIG. 8 depicts a cross-sectional view of the semiconductor structure 80 after selective removal of pFET work function metal 175 and the tungsten layer, layer 180, in accordance with an embodiment of the present invention. PFET work function metal 175 and the layer of tungsten (i.e., layer 180) are removed from a portion of gate dielectric 124 using known processes such as wet chemical etch or RIE. Layer 180 and pFET work function metal 175 are removed over nFET 111 and from the area surrounding nFET 111 as depicted in FIG. 8.

Figure 9:
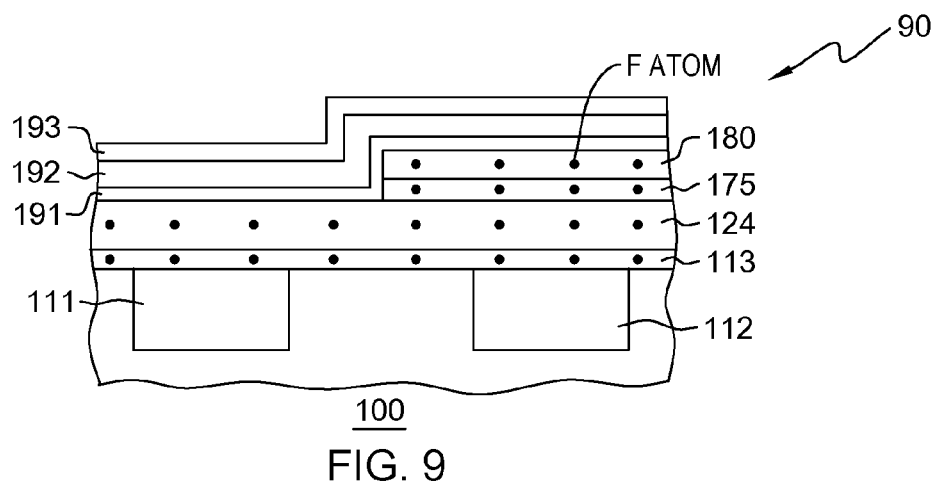
FIG. 9 depicts a cross-sectional view of the semiconductor structure after nFET work function metal deposit in accordance with an embodiment of the present invention.

FIG. 9 depicts a cross-sectional view of semiconductor structure 90 after nFET work function metal deposit in accordance with an embodiment of the present invention. FIG. 9 includes the elements of FIG. 8 and the deposited nFET work function metal layers depicted as barrier 191, nFET work function metal 192, and cap 193. Barrier 191 is a material suitable for a providing a barrier between gate dielectric 124 and nFET work function metal 192. In various embodiments, barrier 191 is composed of TiN. In other embodiments, barrier 191 is composed of other nitride containing metal materials. For example, barrier 191 can be composed of TiSiN or TaN. A typical barrier layer thickness would be in the range 2 angstroms to 25 angstroms. Barrier 191 is deposited with known deposition processes such as MBE, CVD, PECVD, ALD, PVD, or other similar deposition methods. In some embodiments, barrier 191 is not present.

NFET work function metal 192 is deposited on barrier 191. In one embodiment, nFET work function metal 192 is deposited on gate dielectric 124 (e.g., when no barrier 191 is present). NFET work function metal 192 is a work function metal used in an nFET device. Typical nFET work function metals used for nFET work function metal 192 include materials such as Al TiAl, Ti, TaAlC, or TiAlC. Typical layer thickness ranges for nFET work function metal 192 are 20 angstroms to 100 angstroms. NFET work function metal 192 is deposited with known processes such as CVD, PVD, or ALD, for example.

Cap 193 deposited on nFET work function metal 192 by known methods such as CVD, PVD, or ALD. In some embodiments, cap 193 is not present (i.e., cap 193 is an optional layer in semiconductor structure 90). Cap 193 is composed of TiN however; it is not limited to this material and may be composed of another material suitable for a cap on an n type work function metal layer. Cap 193 promotes adhesion of gate electrode metal to semiconductor structure 90.

Figure 10A:
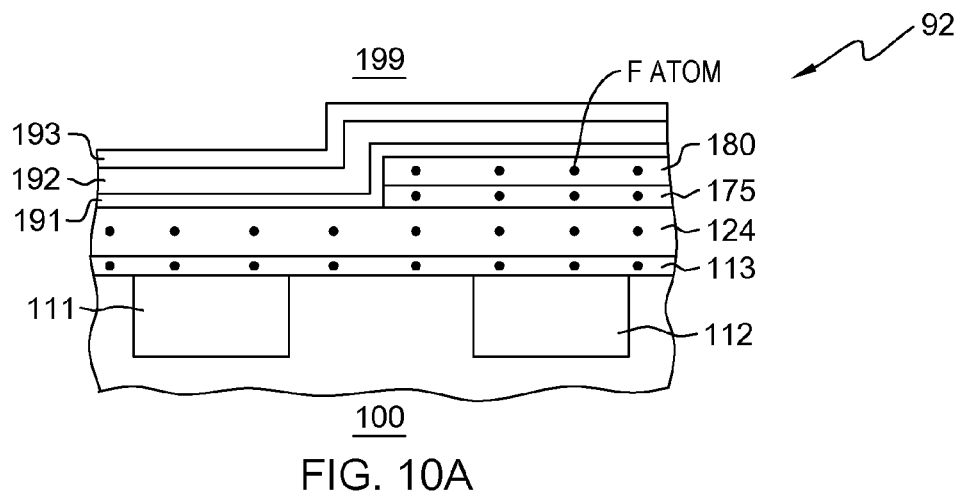
FIG. 10A depicts a cross-sectional view of the semiconductor structure after gate electrode metal deposit in accordance with an embodiment of the present invention.

FIG. 10A depicts a cross-sectional view of semiconductor structure 92 after gate electrode metal deposit in accordance with an embodiment of the present invention. Gate 199 is deposited using any suitable metal gate electrode material. In various embodiments, gate 199 is composed of tungsten. In other embodiments, gate 199 may be one of the following metals: gold, tantalum, tantalum nitride, or platinum, TiN, Co, or Al. Gate 199 may be deposited with known deposition methods such as MBE, CVD, PECVD, ALD, PVD, or other similar deposition methods.

After gate 199 deposition, an annealing process in a reducing environment is performed on semiconductor structure 92. The reducing environment may be a hydrogen gas, a deuterium gas, or include a high pressure anneal in a deuterium gas. Annealing in the reducing environment is performed to further diffusion of fluorine atoms and to incorporate hydrogen or deuterium atoms into semiconductor structure 92. Additionally, in various embodiments, a high temperature anneal is performed. The high temperature anneal can occur at 300 to 500 degrees Celsius. In some embodiments, the high temperature anneal is as high 650 degrees Celsius. As known to one skilled in the art, one or more additional semiconductor manufacturing processes (contact metal deposition, wafer dicing, etc.) may be performed on semiconductor structure 92.

Figure 10B:
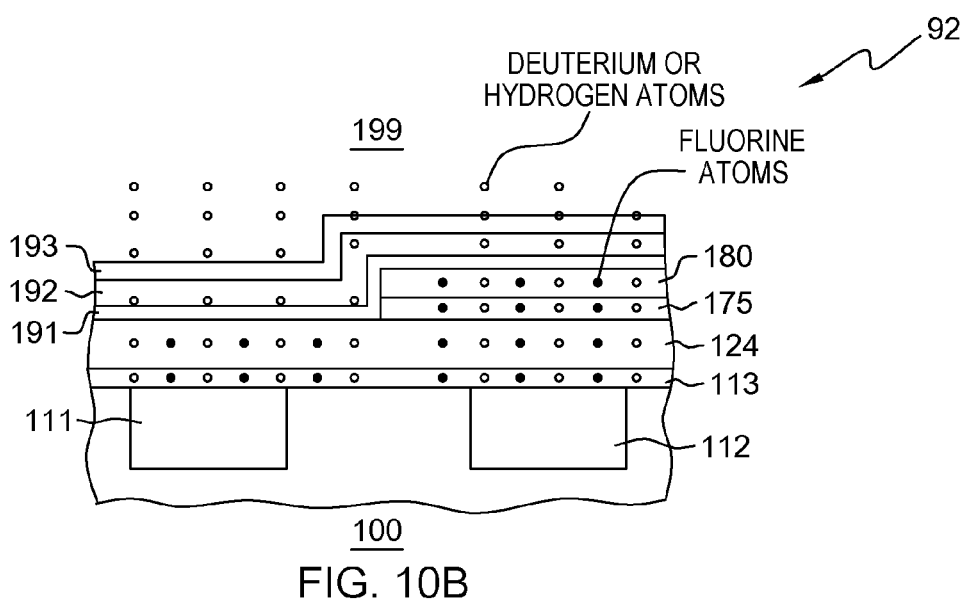
FIG. 10B depicts an illustration of fluorine and reducing gas atom diffusion in the semiconductor structure in accordance with an embodiment of the present invention.

FIG. 10B depicts an illustration of fluorine and reducing gas atom diffusion in semiconductor structure 92 in accordance with an embodiment of the present invention. FIG. 10B is a representation of the incorporation of fluorine atoms and deuterium atoms in semiconductor structure 92. As depicted in FIG. 10B, the dark filled circles represent fluorine atoms and the smaller unfilled circles represent reducing gas atoms such as deuterium or hydrogen atoms, however, in other examples the smaller unfilled circles could be atoms from another reducing gas element. As depicted in FIG. 10B, reducing gas atoms penetrate each of the layers of semiconductor structure 92 except nFET 111, pFET 112, or substrate 100. The fluorine atoms are illustrated as penetrating at least a remaining portion of layer 180, a portion of pFET work function metal 175, gate dielectric 124, and interfacial layer 113. The depth of fluorine atom and reducing atom penetration may vary depending on the thickness of the layers in semiconductor structure 92 and the reducing annealing process (dwell time, anneal temperature, and environment). FIG. 10B is intended to be a representative illustration of the typical incorporation of fluorine and reducing gas atoms (e.g., hydrogen or deuterium atoms) in semiconductor structure 92 however, variations in the depth of incorporation or diffusion of atoms may vary due to process temperature, gas composition, pressure, and dwell time variations during anneal.

Figure 11:
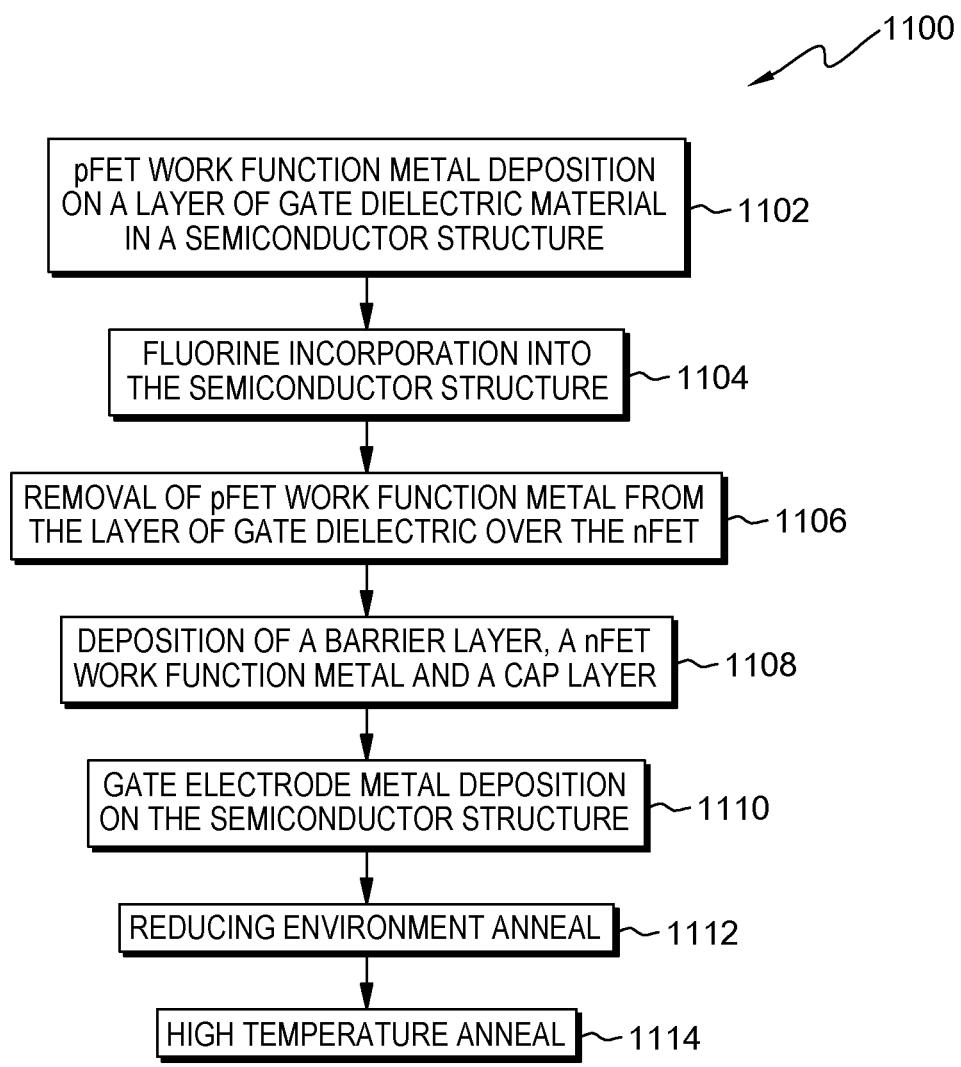
FIG. 11 is a flow chart depicting some of the processes used in FIGS. 8 through 10A to form the semiconductor structure in accordance with an embodiment of the present invention.

FIG. 11 is flow chart 1100 depicting some of the processes used in FIGS. 7 through 10A to form semiconductor structure 92 in accordance with an embodiment of the present invention. Flow chart 1100 summarizes some of the major steps described in the previous detailed discussions for FIG. 7 through FIG. 10A for the formation of semiconductor structure 92.

In step 1102, a pFET work function metal is deposited on a layer of gate dielectric material in a semiconductor structure. The semiconductor structure includes a semiconductor substrate, at least one nFET, and at least one pFET, an interfacial layer and the gate dielectric layer.

In step 1104, fluorine is incorporated into the semiconductor structure. In various embodiments, as depicted in FIG. 7, fluorine incorporation occurs by a deposition of layer 180. Layer 180 is composed of a metal such as tungsten deposited by a process such as CVD with a fluorine-containing precursor or gas source. For example, the fluorine-containing precursor is $WF_6$ that may be followed by a high temperature anneal to drive or diffuse the fluorine atoms into the semiconductor structure.

In other embodiments, fluorine incorporation occurs after step 1102 (pFET work function metal deposition) by annealing the semiconductor structure in a fluorine containing gas environment. Fluorine atoms diffuse from the fluorine containing gas into the semiconductor structure. For example, fluorine atoms diffuse into interfacial layer 113, gate dielectric 124, and pFET work function metal 175. In these other embodiments, layer 180 is not deposited and barrier 191 is deposited directly on pFET work function metal 175. The inclusion of fluorine atoms into a semiconductor structure is known to reduce NBTI.

In step 1106, remove the pFET work function metal from the layer of the gate dielectric material that resides over the nFET. In step 1108, deposition of a barrier layer (an optional layer), an nFET work function metal, and a cap layer occurs. In some embodiments, the barrier layer is not present. In some embodiments, the cap layer is not present. In one embodiment, the barrier layer and the cap layer are not present. The cap layer provides a layer for improved adhesion of additional layers to the nFET work function metal layer. In step 1110, a gate electrode metal is deposited. The gate electrode metal is deposited by known processes over the cap layer on the nFET work function metal.

In step 1112, a reducing environment anneal is performed on the semiconductor structure. The reducing environment anneal incorporates the atoms from the gas in the reducing environment into the semiconductor structure. The reducing environment anneal may be done with a hydrogen gas, a hydrogen and nitrogen mixture (e.g., a forming gas), or a deuterium gas. The reducing environment anneal may be done as a high pressure anneal with deuterium gas in some embodiments. The incorporation of hydrogen or deuterium atoms in the semiconductor structure provides an additional reduction in NBTI.

In step 1114, a high temperature anneal is performed. The high temperature anneal drives the further diffusion of the reducing gas elements into the semiconductor structure. For example, the high temperature anneal in step 1114 drives the hydrogen atoms or deuterium atoms into the interfacial layer as determined by the reducing gas composition.

Figure 12:
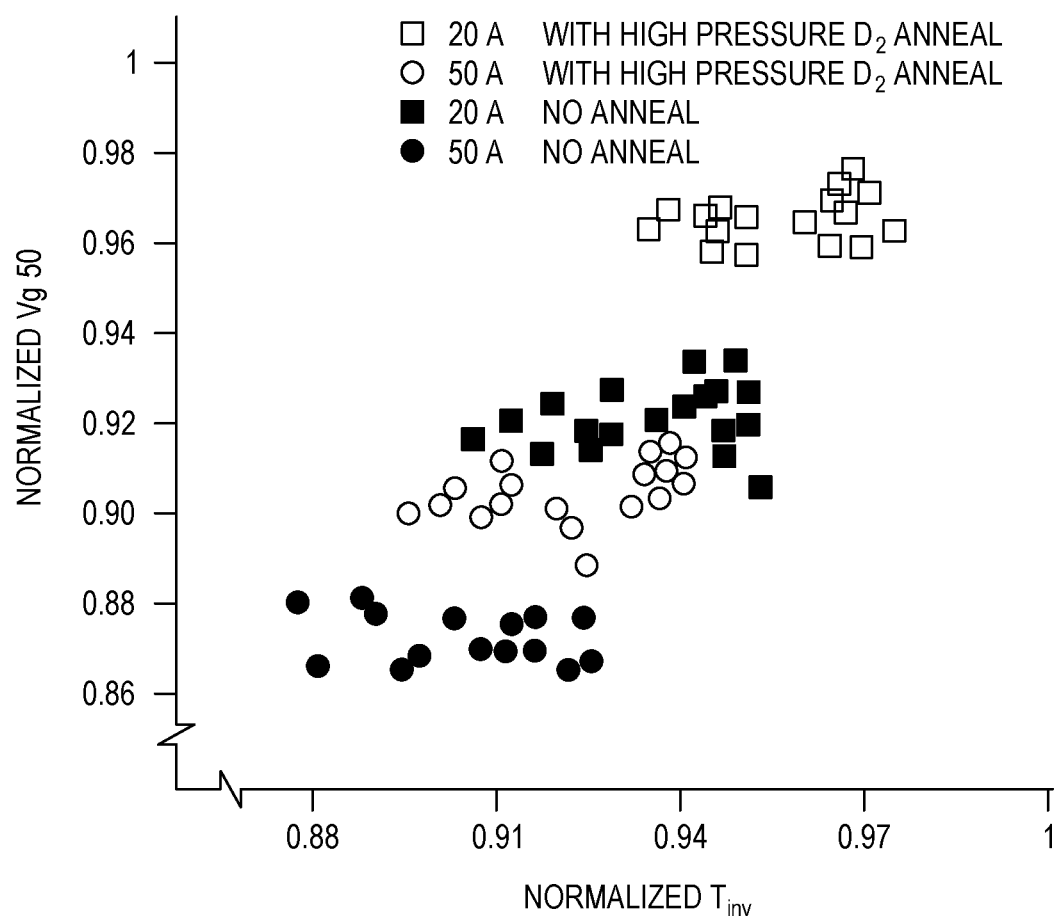
FIG. 12 is an example of a diagram depicting the effect of a high pressure anneal in deuterium on NBTI in accordance with an embodiment of the present invention.

FIG. 12 is an example of a diagram depicting the effect of a high pressure anneal in deuterium on NBTI in accordance with an embodiment of the present invention. FIG. 12 depicts the effect of a high pressure anneal in deuterium (i.e., a high pressure anneal in a reducing environment) on NBTI using RVS (ramped voltage stress) method where the samples created using a 20 Angstrom and 50 Angstrom thickness of a wetting TiN layer. The y-axis is normalized Vg50. Vg50, measured in volts, is the gate stress bias that shifts 50 mV Vt from the original Vt. The x-axis is normalized Tiny. Tiny, measured in angstroms, is the electric thickness of the gate oxide at inversion and represents the equivalent oxide thickness to achieve the corresponding capacitance. As depicted in FIG. 12, a thinner layer of TiN allows more fluorine atoms to be driven into the interfacial layer while a deuterium anneal drives more deuterium into the interfacial layer improving the resulting NBTI due to the increase in fluorine atoms.

In some embodiments, the wafers formed by the embodiments of the present invention may be diced in semiconductor chip form. The resulting semiconductor chips can be distributed by the fabricator in raw wafer form (that is, as a single wafer that has multiple unpackaged chips), as a bare die or in a packaged form. In the latter case, the chip is mounted in a single chip package (such as a plastic carrier, with lead that is affixed to a motherboard or other higher-level carrier) or in a multichip package (such as a ceramic carrier that has either or both surface interconnections or buried interconnections). In any case, the chip is then integrated with other chips, discreet circuit elements, and motherboard or (b) end product. The end product can be any product that includes integrated circuit chips, ranging from toys and other low-end applications to advanced computer products having a display, a keyboard or other input device and a central processor.

What is claimed is:

1. A method of forming a semiconductor structure with improved negative bias temperature instability, the method comprising:
   diffusing fluorine atoms into a semiconductor structure by an anneal in a fluorine containing gas;
   removing a pFET work function metal layer from an area above an nFET wherein the area above the nFET includes at least the area over the nFET;
   depositing a layer of nFET work function metal on a remaining portion of the pFET work function metal;
   depositing a gate metal over the nFET work function metal layer; and
   performing an anneal in a reducing environment followed by a high temperature anneal.

2. The method of claim 1, wherein the reducing environment includes at least one of: a forming gas, a hydrogen gas, a deuterium gas, a high pressure deuterium gas, a hydrogen and nitrogen gas mixture, and a deuterium gas and nitrogen gas mixture.

3. The method of claim 1, further comprises at least one of: depositing a barrier layer on the gate dielectric layer and depositing a cap layer on the nFET work function metal layer.

4. The method of claim 1, further comprises:
   depositing a layer of metal by chemical vapor deposition in a fluorine containing environment on the pFET work function metal layer, the deposition incorporating fluorine into the semiconductor structure;
   removing a portion of the layer of metal and a portion of the pFET work function metal layer from an area above the nFET wherein the area above the nFET includes at least the area over at least the nFET;
   depositing a nFET work function metal layer over a remaining portion of the layer of metal and an exposed portion of a gate dielectric layer;
   depositing a gate metal on the nFET work function metal layer; and
   performing an anneal in a reducing environment followed by a high temperature anneal.

5. The method of claim 4, wherein depositing a gate metal occurs in an environment that contains one of $WF_6$, $NF_3$, and $F_2$.

6. The method of claim 4, wherein depositing a gate metal occurs by chemical vapor deposition of the gate metal and the gate metal is composed of tungsten.

7. The method of claim 1, wherein annealing in the reducing environment includes an environment with a deuterium gas at one to twenty-eight atmospheres of pressure.

8. The method of claim 1, further comprising forming an interfacial layer on a semiconductor substrate wherein the semiconductor substrate includes the nFET, a gate dielectric layer deposited on the interfacial layer, and depositing the pFET work function metal layer on the gate dielectric layer.

9. The method of claim 1, wherein depositing the layer of nFET work function metal on the remaining portion of the pFET work function metal further comprises depositing the layer of nFET work function metal on an exposed portion of a gate dielectric layer.

10. The method of claim 8, wherein the interfacial layer is composed of SixOy, SiNxOy, and any other interfacial materials.

* * * * *